(12) United States Patent
Goto (10) Patent No.: US 8,405,638 B2
(45) Date of Patent: Mar. 26, 2013

(54) SENSOR SYSTEM AND OPTICAL TOUCH SENSOR

(75) Inventor: Hiroshi Goto, Ibaraki (JP)

(73) Assignee: Empire Technology Development LLC, Wilmington, DE (US)

( * ) Notice: Subject to any disclaimer, the term of this patent is extended or adjusted under 35 U.S.C. 154(b) by 480 days.

(21) Appl. No.: 12/645,176

(22) Filed: Dec. 22, 2009

(65) Prior Publication Data
US 2011/0148814 A1    Jun. 23, 2011

(30) Foreign Application Priority Data
Dec. 22, 2009    (JP) .................................. 2009-290053

(51) Int. Cl.
*G06F 3/042* (2006.01)
(52) U.S. Cl. ....................................................... 345/175
(58) Field of Classification Search .................. None
See application file for complete search history.

(56) References Cited

FOREIGN PATENT DOCUMENTS

| EP | 0257955 | 3/1988 |
|---|---|---|
| JP | 63-075542 | 5/1988 |
| JP | 10-162698 | 6/1998 |
| JP | 2002-257720 | 9/2002 |
| JP | 2006-112808 | 4/2006 |

OTHER PUBLICATIONS

Sumriddetchkajorn, Sawn et al., "Surface plasmon resonance-based highly sensitive optical touch sensor with a hybrid noise rejection scheme," Applied Optics, vol. 45, No. 1, Jan. 1, 2006, pp. 172-177.
Kawata et al., "What is a 'Surface Plasmon Resonance Sensor'?," Protein, Nucleic Acid, Enzyme, vol. 37, No. 15, 1992, pp. 81-87 (with English translation, pp. 1-15).
Notice of Reasons for Rejection for JP 2009-290053 mailed Apr. 27, 2010 (with English translation).
Nakajima, H., "Development of a Portable Multichannel Surface Plasmon Resonance Sensor" The 68th Symposium on Analytical Chemistry in 2007 held by the Japan Society for Analytical Chemistry.

*Primary Examiner* — Regina N Holder
*Assistant Examiner* — Brian Butcher
(74) *Attorney, Agent, or Firm* — Foley & Lardner LLP (57) ABSTRACT

Provided is an optical touch sensor including an optical path through which light propagates, a metal layer disposed on the optical path, a flexible touch key configured to contact the metal layer when being bent, an incident light reflecting surface configured to make the light that propagates through the optical path be incident on the metal layer at an angle at which surface plasmon resonance occurs when the metal layer and the touch key are separated from each other, and a detector configured to detect reflected light from the metal layer and determine that the touch key is pressed in the case where an intensity of the reflected light increases.

20 Claims, 15 Drawing Sheets

SENSOR SYSTEM AND OPTICAL TOUCH SENSOR

CROSS REFERENCE TO RELATED APPLICATION

This application claims the benefit of Japanese Application No. 2009-290053 filed on Dec. 22, 2009 which is incorporated herein by reference.

BACKGROUND

1. Technical Field

The present disclosure relates to a user interface. In particular, the present disclosure relates to a sensor system and an optical touch sensor.

2. Related Art

In everyday life, various services using augmented reality are becoming available. In the field of bioscience, various biosensors have been proposed (see, for example, Satoshi Kawata, Toshio Takagi, "About Surface Plasmon Resonance", Protein, Nucleic Acid and Enzyme, 1992, Vol. 37, No. 15, p. 81).

SUMMARY

Existing keyboards are configured such that an insulating sheet having a hole is sandwiched between two contact sheets and contact points contact each other when a key is pressed. Such keyboards have a problem in that the structure is complex and flexibility in design is limited. The present disclosure provides a sensor system and an optical touch sensor that solves the above problem.

An aspect of the present disclosure provides a sensor system including a plurality of optical touch sensors arranged in parallel with each other or in a matrix pattern, wherein each of the plurality of optical touch sensors includes a flexible optical path through which light propagates, a flexible metal layer disposed on the optical path, the metal layer having a thickness equal to or smaller than half a wavelength of the light that propagates through the optical path or the metal layer including a structure having a size equal to or smaller than half the wavelength of the light that propagates through the optical path, a flexible touch key configured to contact the metal layer when being bent, an incident light reflecting surface disposed on the optical path, the incident light reflecting surface making the light that propagates through the optical path be incident on the metal layer at an angle at which surface plasmon resonance occurs when the metal layer and the touch key are separated from each other, and a detector configured to detect reflected light from the metal layer and determine that the touch key is pressed in the case where an intensity of the reflected light increases.

Another aspect of the present disclosure provides a sensor system including a plurality of optical touch sensors arranged in parallel with each other or in a matrix pattern, wherein each of the plurality of optical touch sensors includes an optical path through which light propagates, a metal layer disposed on the optical path, a flexible touch key configured to contact the metal layer when being bent, an incident light reflecting surface configured to make the light that propagates through the optical path be incident on the metal layer at an angle at which surface plasmon resonance occurs when the metal layer and the touch key are separated from each other, and a detector configured to detect reflected light from the metal layer and determine that the touch key is pressed in the case where an intensity of the reflected light increases.

Still another aspect of the present disclosure provides an optical touch sensor including an optical path through which light propagates, a metal layer disposed on the optical path, a flexible touch key configured to contact the metal layer when being bent, an incident light reflecting surface configured to make the light that propagates through the optical path be incident on the metal layer at an angle at which surface plasmon resonance occurs when the metal layer and the touch key are separated from each other, and a detector configured to detect reflected light from the metal layer and determine that the touch key is pressed in the case where an intensity of the reflected light increases.

DESCRIPTION OF EXEMPLARY EMBODIMENTS

Hereinafter, embodiments of the present disclosure will be described. In the following description of the drawings, the same or similar components are denoted by the same or similar numerals. The drawings are schematic, and specific sizes and the like should be understood with reference to the following description. Needless to say, relative sizes and scales are different between some of the drawings.

First Embodiment

Figure 1:
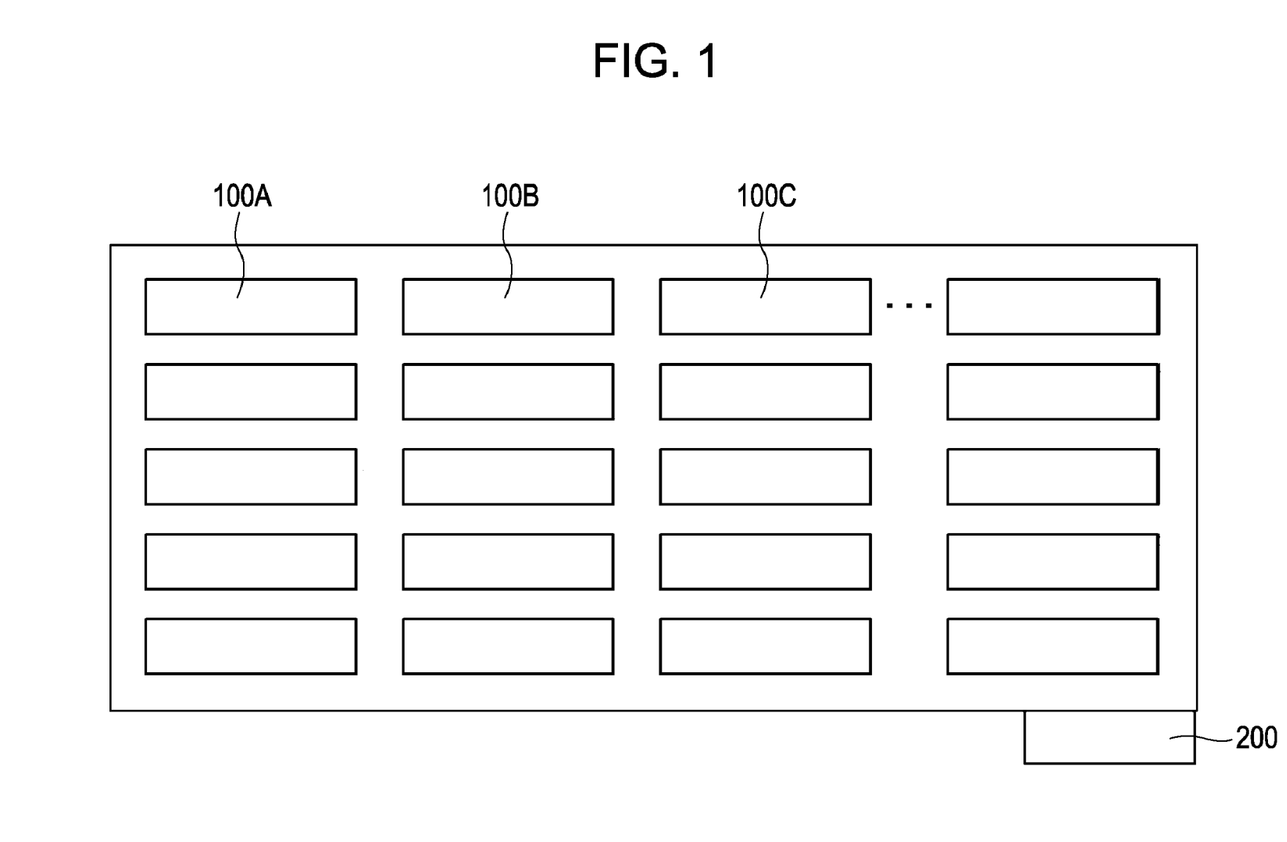
FIG. 1 is a top view of a sensor system according to a first embodiment.
Figure 2:
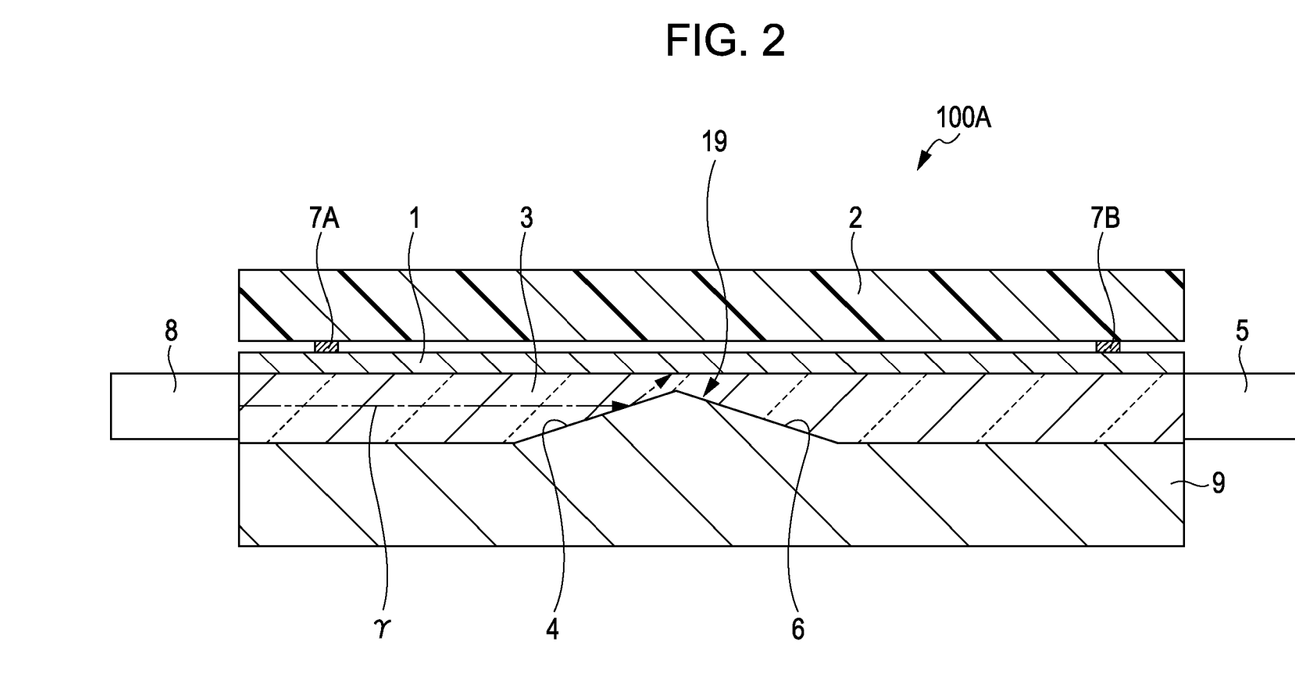
FIG. 2 is a first sectional view of an optical touch sensor according to the first embodiment.
Figure 3:
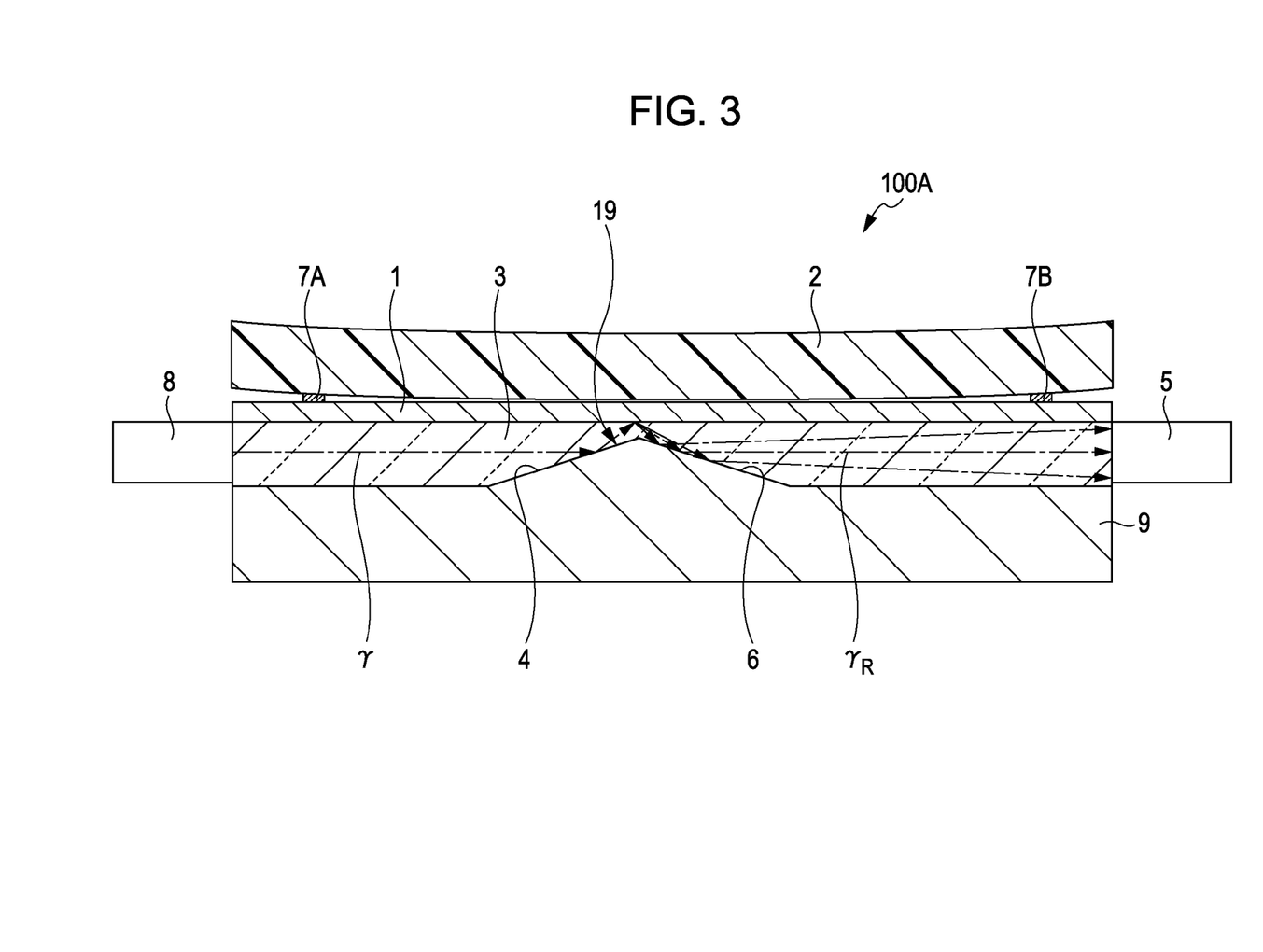
FIG. 3 is a second sectional view of the optical touch sensor according to the first embodiment.

As illustrated in the top view of FIG. 1, a sensor system according to a first embodiment includes a plurality of optical touch sensors 100A, 100B, 100C, . . . that are arranged in a matrix pattern. As illustrated in the sectional view of FIG. 2, each of the optical touch sensors 100A, 100B, 100C, . . . includes an optical path 3 through which light γ propagates, a metal layer 1 disposed on the optical path 3, a touch key 2, an incident light reflecting surface 4, and a detector 5. The touch key 2 is flexible and contacts the metal layer 1 when the touch key 2 is bent as illustrated in FIG. 3. The incident light reflecting surface 4 makes the light γ that propagates through the optical path 3 incident on the metal layer 1 at an angle at which surface plasmon resonance occurs when the metal layer 1 and the touch key 2 are separated from each other as illustrated in FIG. 2. The detector 5 detects reflected light $\gamma_R$ from the metal layer 1, which is illustrated in FIG. 3, and determines that the touch key 2 is pressed if the intensity of the reflected light increases.

Visible laser light having a wavelength in the range of 400 to 800 nm, ultraviolet (UV) laser light, or the like can be used as the light γ that propagates through the optical path 3 illustrated in FIG. 2. A light emitter 8 emits the light γ that propagates through the optical path 3. As the light emitter 8, a laser diode (LD) or a light emitting diode (LED), for example, can be used. The optical path 3 is disposed on a supporting body 9 including a wedge-shaped protrusion 19. The supporting body 9 is made of, for example, a metal such as aluminum.

The optical path 3 is made of a material having an index of refraction higher than that of the supporting body 9. Polymethyl methacrylate (PMMA) material, polycarbonate, polystyrene, deuterated polymer, quartz glass, or the like can be used as the material for the optical path 3. The optical path 3 may guide the light γ by using an optical waveguide phenomenon. The metal layer 1 has a thickness equal to or smaller than half the wavelength of the light γ that propagates through the optical path 3. The metal layer 1 is made of a material having an index of refraction lower than that of the optical path 3. Metal such as gold or silver can be used as the material for the metal layer 1. The optical path 3 and the metal layer 1 may be in contact with each other or integrated with each other.

One surface of the wedge-shaped protrusion 19 of the supporting body 9 nearer to the light emitter 8 serves as the incident light reflecting surface 4 that totally reflects at least a part of the light γ, which propagates through the optical path 3, toward the metal layer 1. The other surface of the wedge-shaped protrusion 19 farther from the light emitter 8 serves as a reflected light reflecting surface 6 that totally reflects the reflected light $\gamma_R$ from the metal layer 1 toward the detector 5. The incident light reflecting surface 4 disposed on the optical path 3 keeps the angle of incidence of the light γ on the metal layer 1 constant.

A surface plasmon exists on a surface of the metal layer 1. When the light γ is incident on the metal layer 1 at a resonance angle larger than the total reflection angle, the surface plasmon resonates with an evanescent wave that has penetrated to the surface of the metal layer 1 having a thickness equal to or smaller than half the wavelength of the light γ, and the energy of the light γ is converted to the oscillation energy of the surface plasmon. The incident light reflecting surface 4 defines the angle of incidence of the light γ on the metal layer 1 so that surface plasmon resonance occurs when the metal layer 1 and the touch key 2 are separated from each other. Therefore, when the metal layer 1 is separated from the touch key 2, reflected light from the metal layer 1 is not generated or is generated at a low intensity.

The touch key 2 is disposed on the metal layer 1 with spacers 7A and 7B therebetween. As illustrated in FIG. 3, the touch key 2 is flexible and can contact the metal layer 1 when touched by a user's finger. As the material of the touch key 2, epoxy resin, for example, can be used. However, the material is not limited thereto, as long as the material is flexible.

The wave number of the surface plasmon generated by the above-mentioned surface plasmon resonance depends on the permittivity of the surface of the metal layer 1 and the index of refraction of a medium in contact with the metal layer 1. When the touch key 2 contacts the metal layer 1, the medium in contact with the metal layer 1 is changed from air to the touch key 2, whereby a change in the permittivity of the surface of the metal layer 1 and a change the index of refraction of the medium in contact with the metal layer 1 occur. Therefore, the resonance angle, which is the angle of incidence of the light γ at which surface plasmon resonance occurs, changes from that in the case where the metal layer 1 and the touch key 2 are separated from each other. However, the angle of incidence of the light γ on the metal layer 1 is kept constant by the incident light reflecting surface 4. Therefore, when the touch key 2 contacts the metal layer 1, surface plasmon resonance does not occur. As a result, the intensity of the reflected light $\gamma_R$ from the metal layer 1 increases as compared with that in the case where the surface plasmon resonance occurs.

The reflected light $\gamma_R$ from the metal layer 1 is totally reflected by the reflected light reflecting surface 6, propagates through the optical path 3, and reaches the detector 5. The detector 5, which includes light-receiving elements and other components, detects the change in the intensity of the reflected light $\gamma_R$ caused by contact and separation of the touch key 2 and the metal layer 1.

The sensor system illustrated in FIG. 1 further includes a position determiner 200. The position determiner 200 is electrically connected to the detector 5 of each of the optical touch sensors 100A, 100B, 100C, . . . . When the detector 5 of each of the optical touch sensors 100A, 100B, 100C, . . . detects an increase in the intensity of the reflected light $\gamma_R$, the detector 5 sends a detection signal to the position determiner 200. On the basis of the sender of the detection signal, the position determiner 200 determines which of the optical touch sensors 100A, 100B, 100C, . . . is pressed.

Next, a method for manufacturing the optical touch sensor 100A according to the first embodiment will be described.

Figure 4:
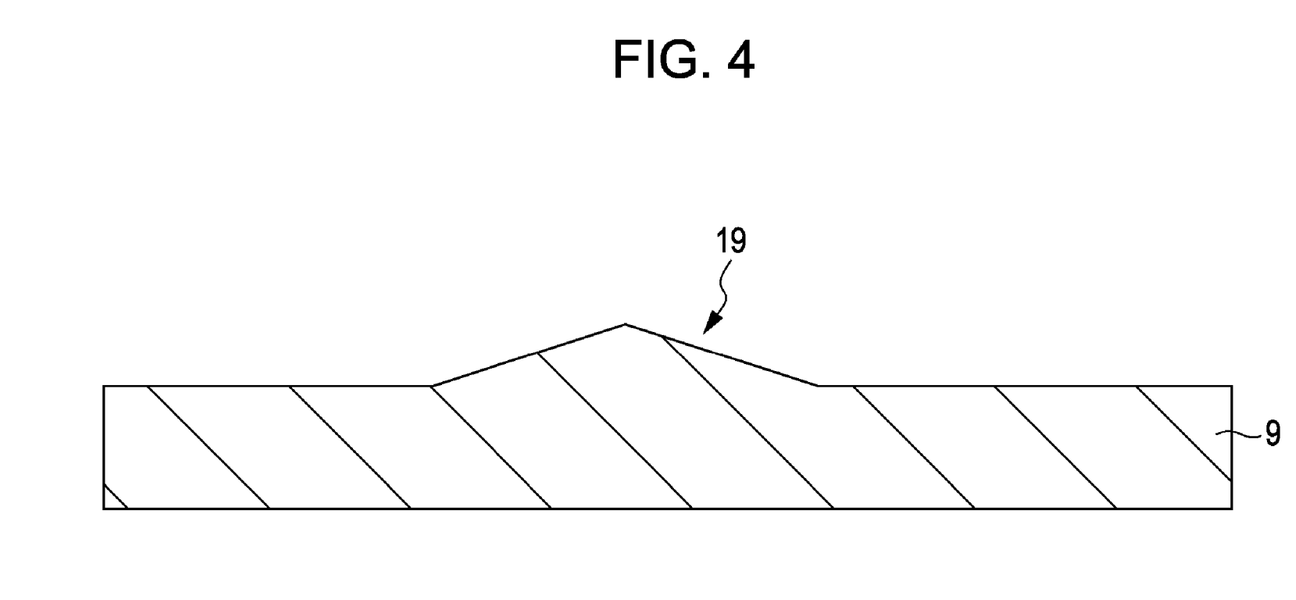
FIG. 4 is a first sectional view illustrating a process of making the optical touch sensor according to the first embodiment.
Figure 5:
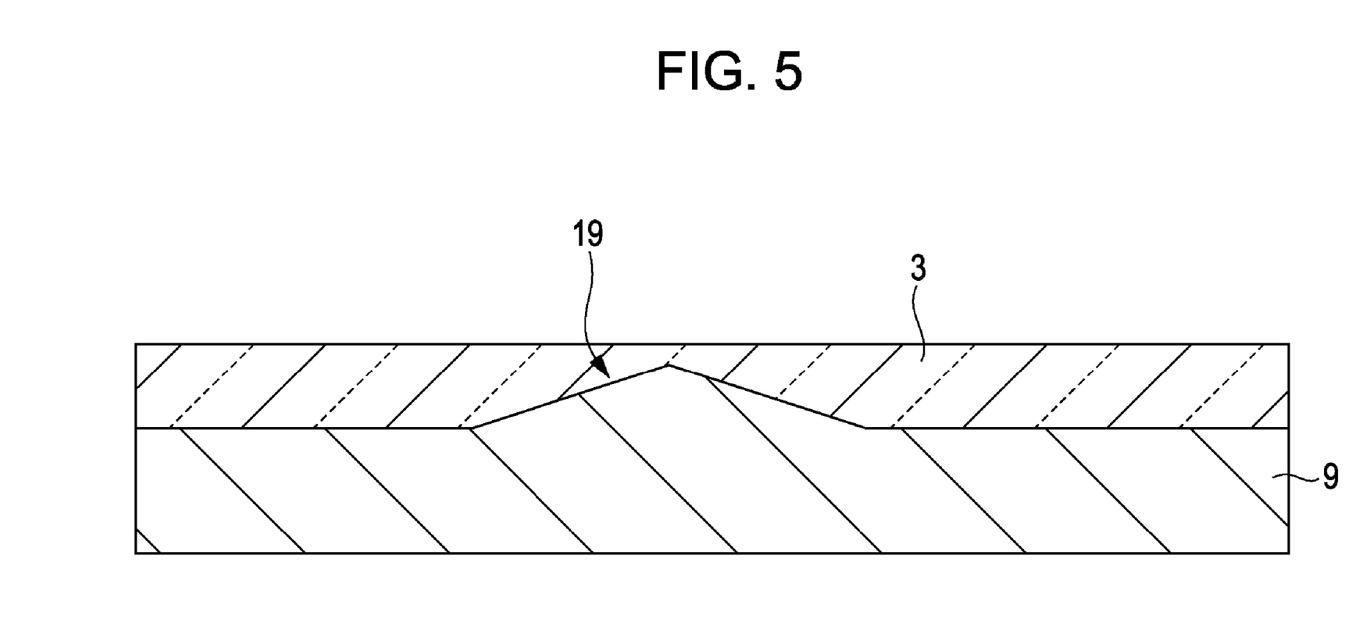
FIG. 5 is a second sectional view illustrating the process of making the optical touch sensor according to the first embodiment.
Figure 6:
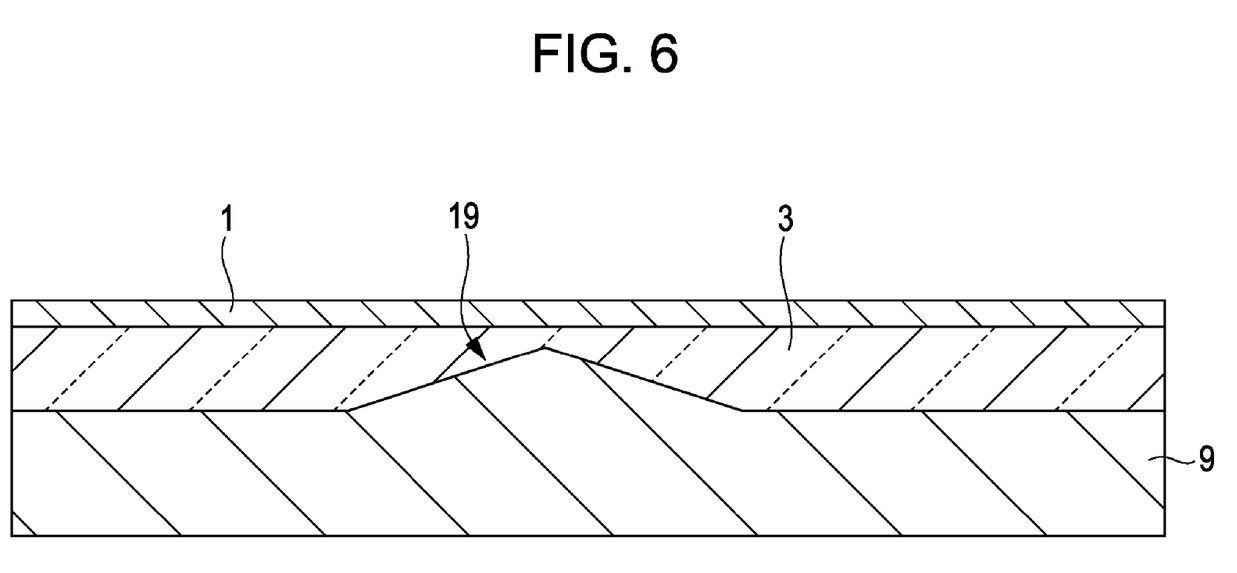
FIG. 6 is a third sectional view illustrating the process of making the optical touch sensor according to the first embodiment.

First, as illustrated in FIG. 4, the supporting body 9 including the wedge-shaped protrusion 19 is prepared. The wedge-shaped protrusion 19 can be formed by photolithography or embossing. Next, as illustrated in FIG. 5, the optical path 3 is formed on the supporting body 9 by applying molten resin or the like on the supporting body 9. The optical path 3 may be formed by chemical vapor deposition (CVD) or the like. Subsequently, as illustrated in FIG. 6, the metal layer 1 is formed on the optical path 3 by evaporating metal onto the optical path 3.

Figure 7:
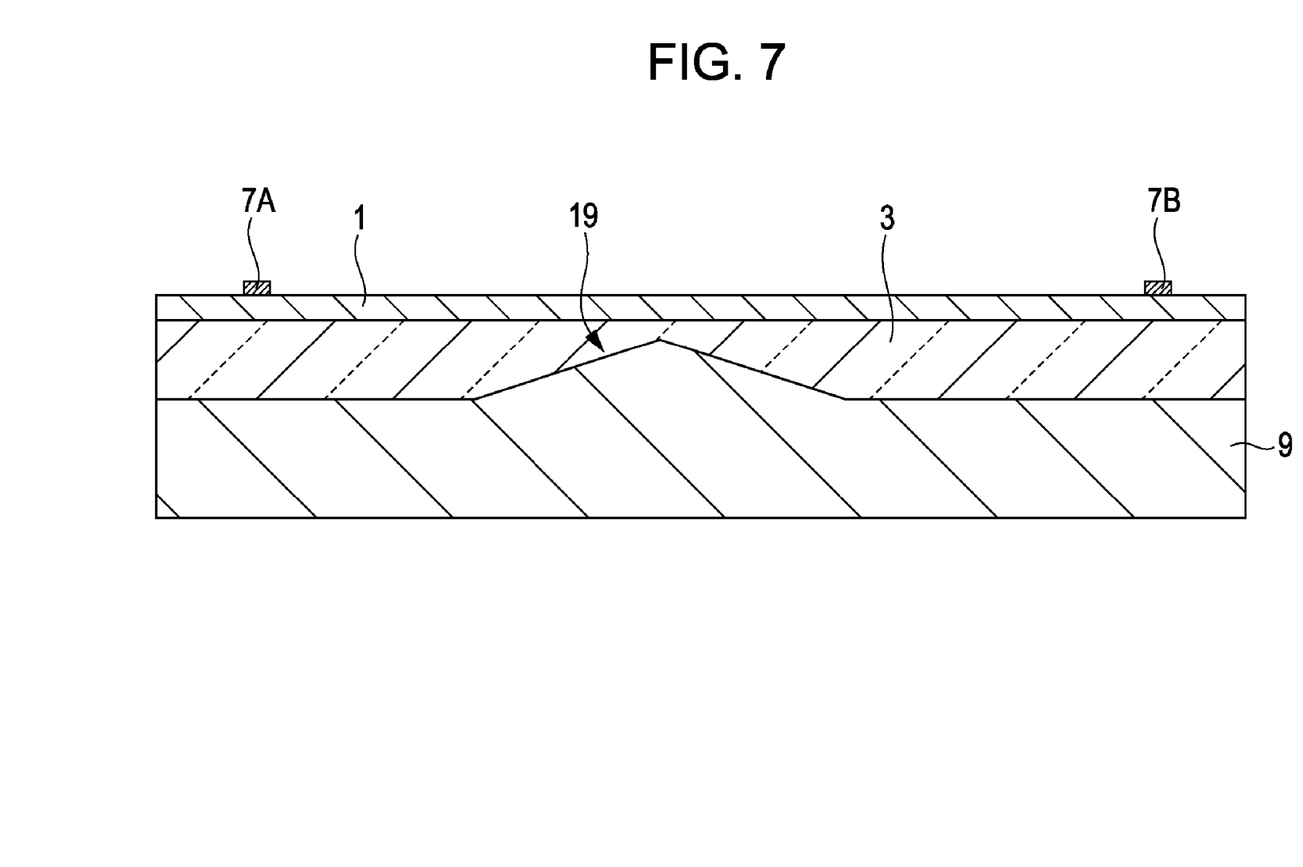
FIG. 7 is a fourth sectional view illustrating the process of making the optical touch sensor according to the first embodiment.
Figure 8:
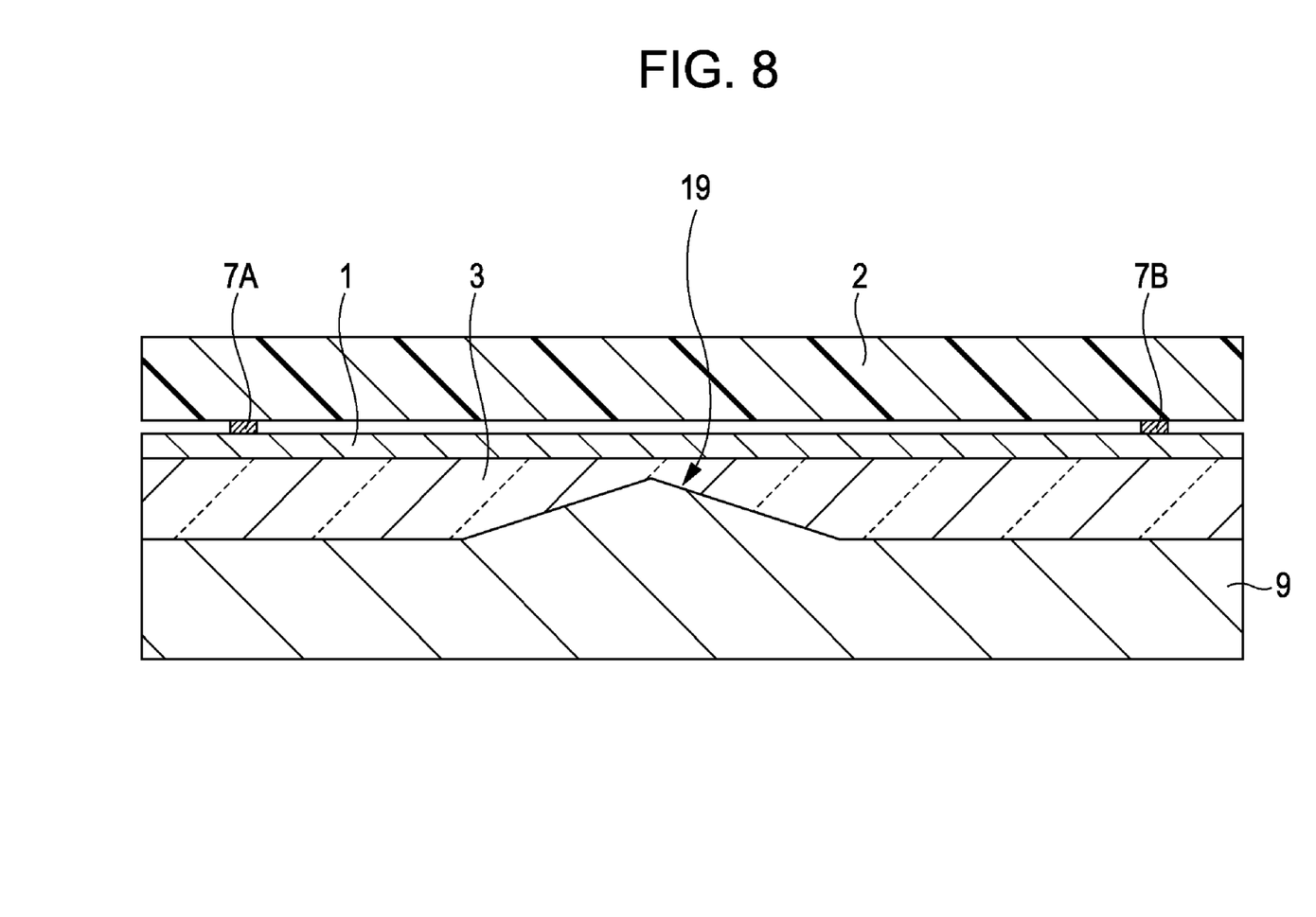
FIG. 8 is a fifth sectional view illustrating the process of making the optical touch sensor according to the first embodiment.
Figure 9:
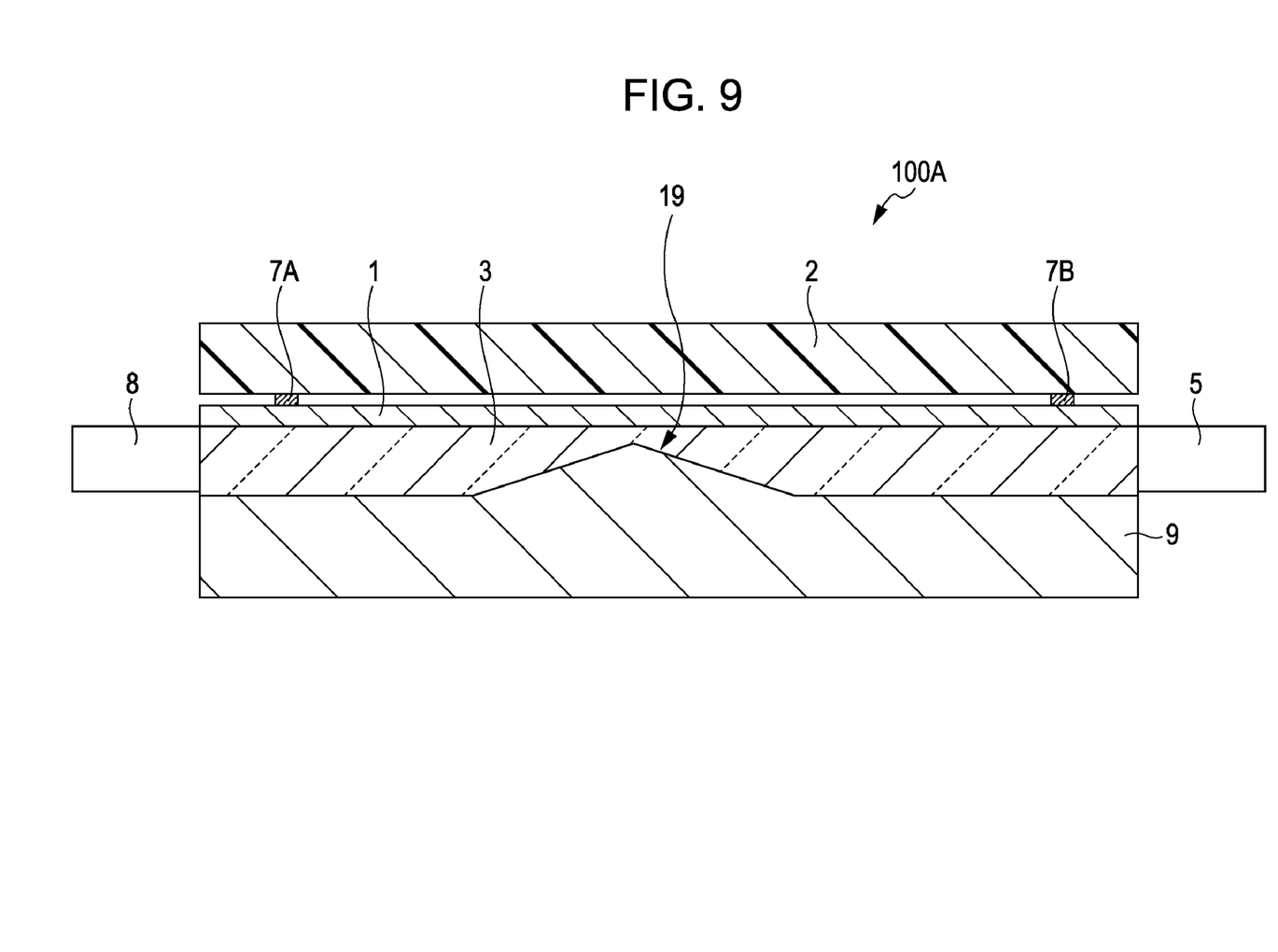
FIG. 9 is a sixth sectional view illustrating the process of making the optical touch sensor according to the first embodiment.

Next, as illustrated in FIG. 7, the spacers 7A and 7B are attached to the metal layer 1 using an adhesive or the like. Moreover, as illustrated in FIG. 8, the touch key 2 is attached to the spacers 7A and 7B using an adhesive or the like. Alternatively, the touch key 2 and the spacers 7A and 7B may be integrated with each other beforehand, and then the integral structure including the touch key 2 and the spacers 7A and 7B may be disposed on the metal layer 1. Subsequently, as illustrated in FIG. 9, the light emitter 8 is disposed at one end of the optical path 3, and the detector 5 is disposed at the other end of the optical path 3, whereby the optical touch sensor 100A according to the first embodiment is completed.

The optical touch sensor 100A is highly reliable because the optical touch sensor 100A has a simple structure. Because pressing of the touch key 2 is detected without using an electrode, the optical touch sensor 100A can be easily manufactured as compared with a sensor including an electrode. The touch key 2 may be provided with any shape using techniques such as injection molding. Therefore, a product including the sensor system has a high flexibility in design.

Figure 10:
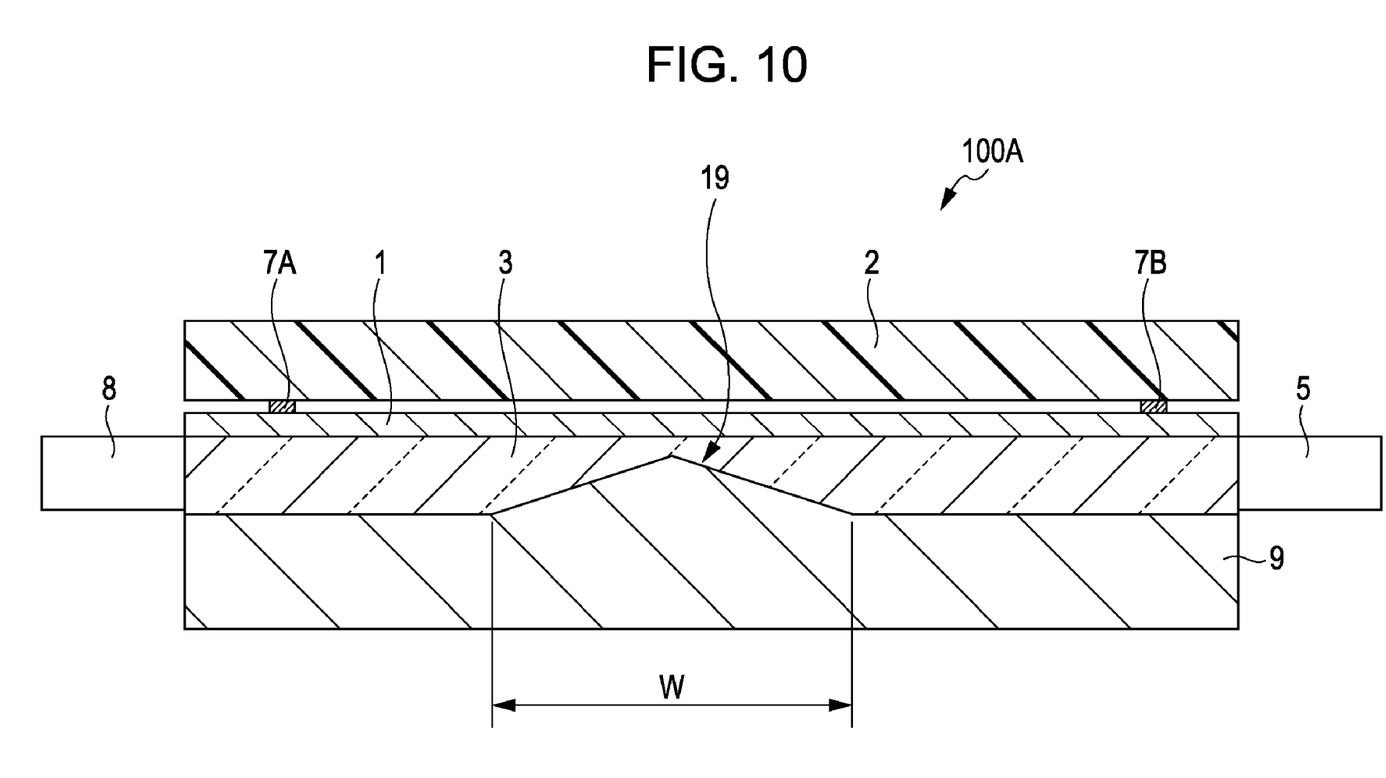
FIG. 10 is a third sectional view of the optical touch sensor according to the first embodiment.

By making the supporting body 9, the optical path 3, and the metal layer 1 flexible, the sensor system illustrated in FIG. 1 can be attached to curved surfaces such as the surface of a human body or clothing. In this case, for example, the width W of the bottom of the wedge-shaped protrusion 19 illustrated in FIG. 10 is set to be in the range of 50 nm to 500 μm or in the range of 100 μm to 200 μm. By making the ratio of the width of the wedge-shaped protrusion 19 to the radius of curvature of the sensor system attached to the surface of a human body or clothing smaller, the angle of incidence of the light γ incident on the metal layer 1 is prevented from being changed owing to the curvature of the sensor system.

Modification of First Embodiment

Figure 11:
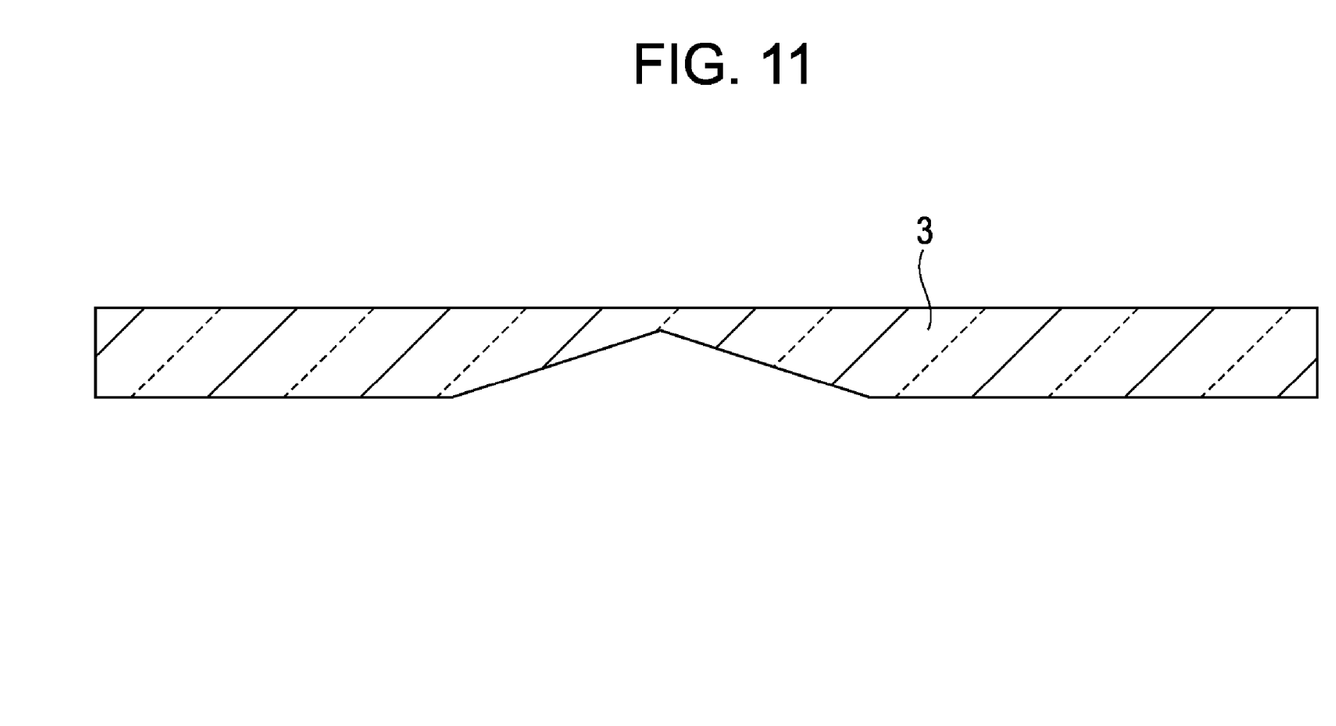
FIG. 11 is a sectional view illustrating a process of making an optical touch sensor according to a modification of the first embodiment.

In the first embodiment, the optical path 3 is formed by applying molten resin or the like on the supporting body 9 illustrated in FIGS. 4 and 5. Alternatively, as illustrated in FIG. 11, an optical path 3 including a recess may be first prepared. The recess is formed by, for example, etching the optical path 3 made of quartz glass or the like. Subsequently, metal is evaporated onto a surface of the optical path 3 in which the recess is formed, so that the supporting body 9 illustrated in FIG. 5 is formed. Alternatively, the supporting body 9 may be formed on the surface of the optical path 3 in which the recess is formed by screen printing.

In this case, a mold may be manufactured by first preparing a structure having a shape the same as that of the optical path 3 illustrated in FIG. 11 and then transferring the shape to a highly durable metal or the like by using the structure as a template. The optical path 3 can be mass-produced with a nanoimprinting technique in which molten resin is injected into the mold.

Second Embodiment

Figure 12:
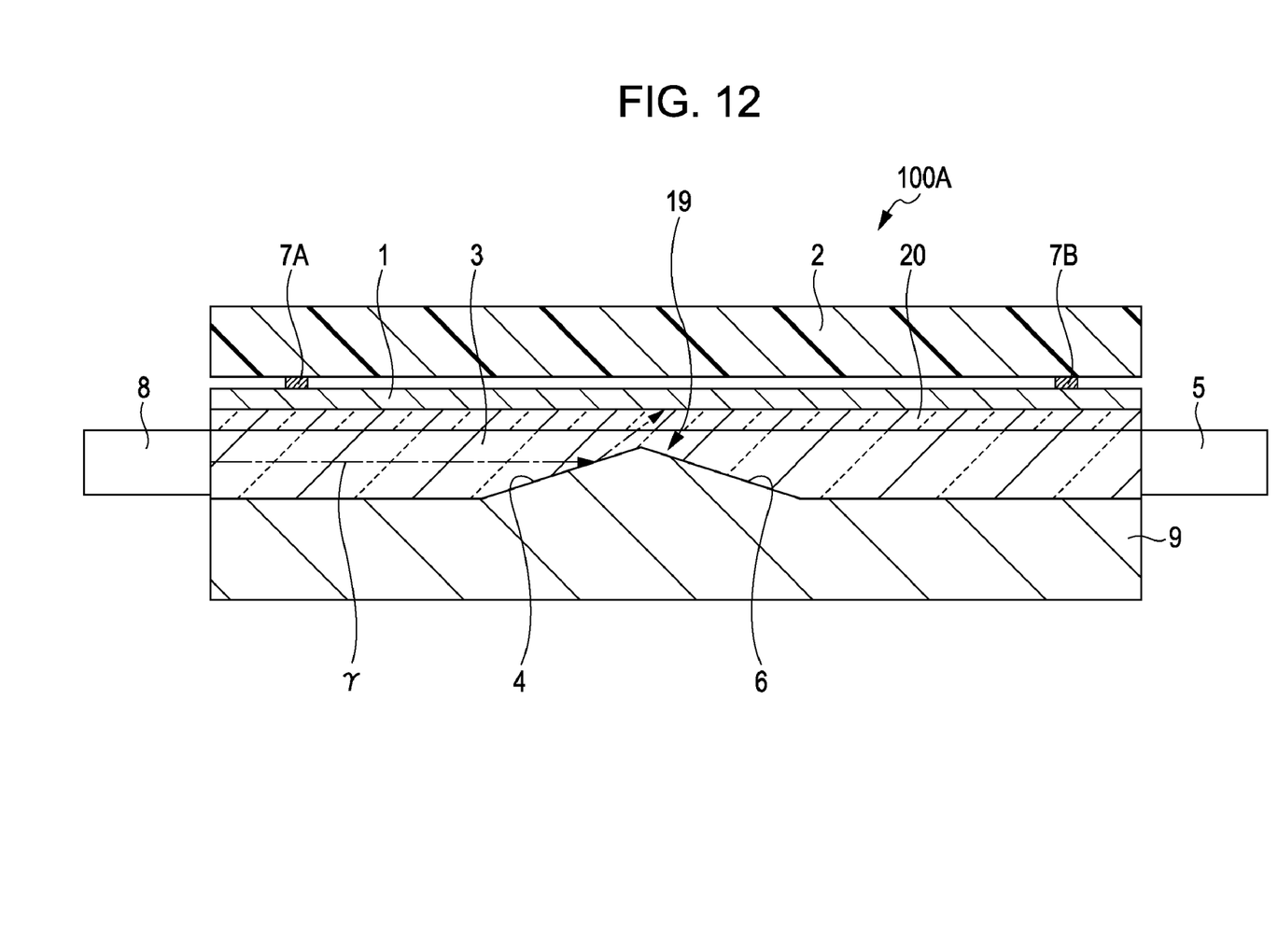
FIG. 12 is a sectional view of an optical touch sensor according to a second embodiment.

In the first embodiment, the metal layer 1 is disposed directly on the optical path 3 shown in FIG. 2 of each of the optical touch sensors 100A, 100B, 100C, . . . that are included in the sensor system illustrated in FIG. 1. In contrast, as illustrated in FIG. 12, an optical touch sensor 100A according to the second embodiment further includes a transparent layer 20 disposed between the optical path 3 and the metal layer 1. The transparent layer 20 is made of, for example, a transparent material having the same index of refraction as the optical path 3. By appropriately setting the strength, the thickness, and other properties of the transparent layer 20, the size and the strength of the optical touch sensor 100A can be appropriately set.

Third Embodiment

In the first embodiment, the optical touch sensors 100A, 100B, 100C, . . . are arranged in a matrix pattern as illustrated in FIG. 1. In contrast, as illustrated in the top view of FIG. 13, a sensor system according to the third embodiment includes optical touch sensors 103A, 103B, 103C, . . . that are arranged in parallel with each other.

In the first embodiment, as illustrated in FIG. 2, each of the optical touch sensors 100A, 100B, 100C, . . . includes the light emitter 8. In contrast, each of the optical touch sensors 103A, 103B, 103C, . . . according to the third embodiment illustrated in FIG. 13 does not include the light emitter 8 as illustrated in FIG. 14. Instead, the sensor system includes a light emitter 38 common to all optical sensors.

Figure 13:
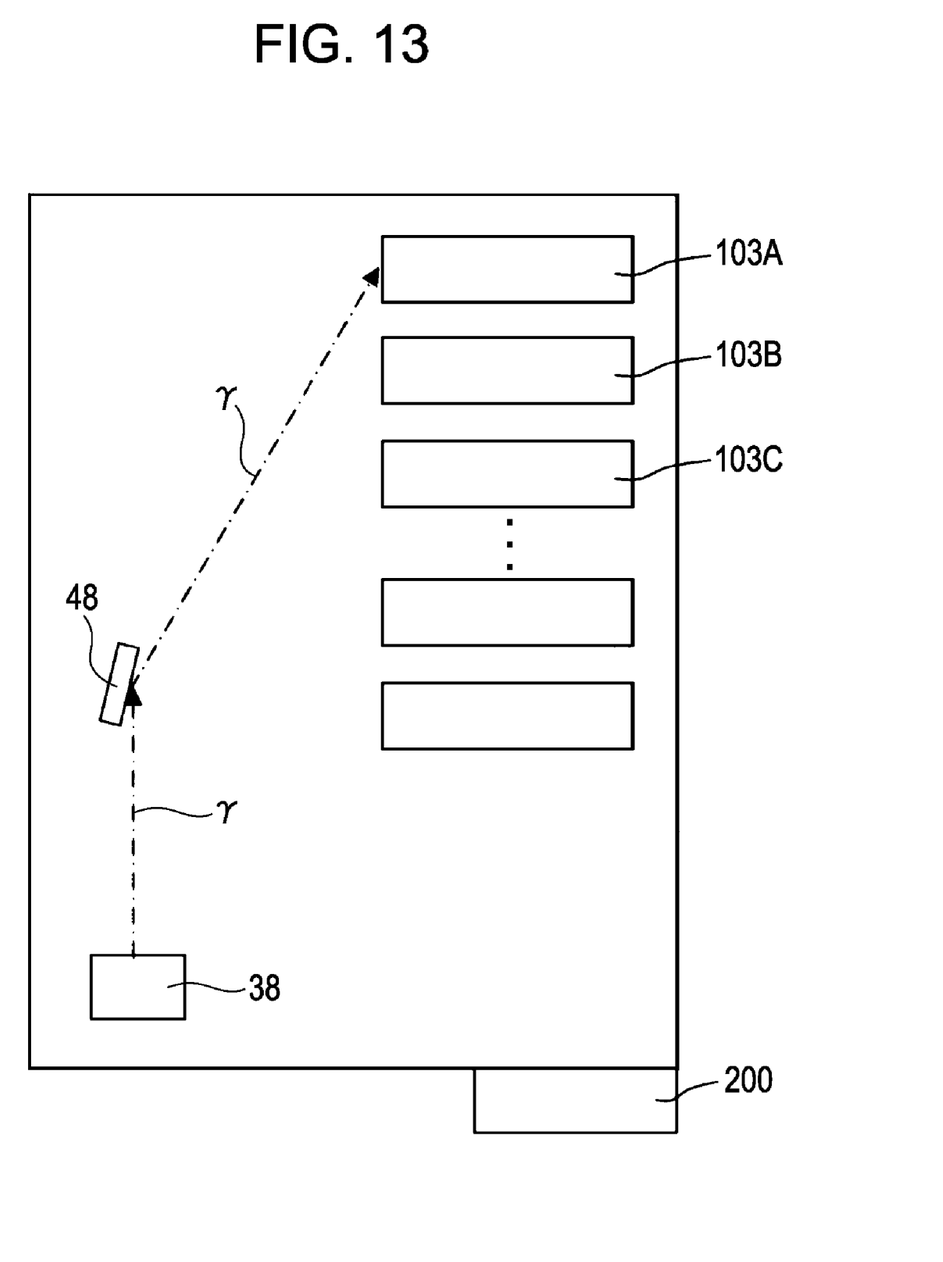
FIG. 13 is a first top view of a sensor system according to a third embodiment.
Figure 14:
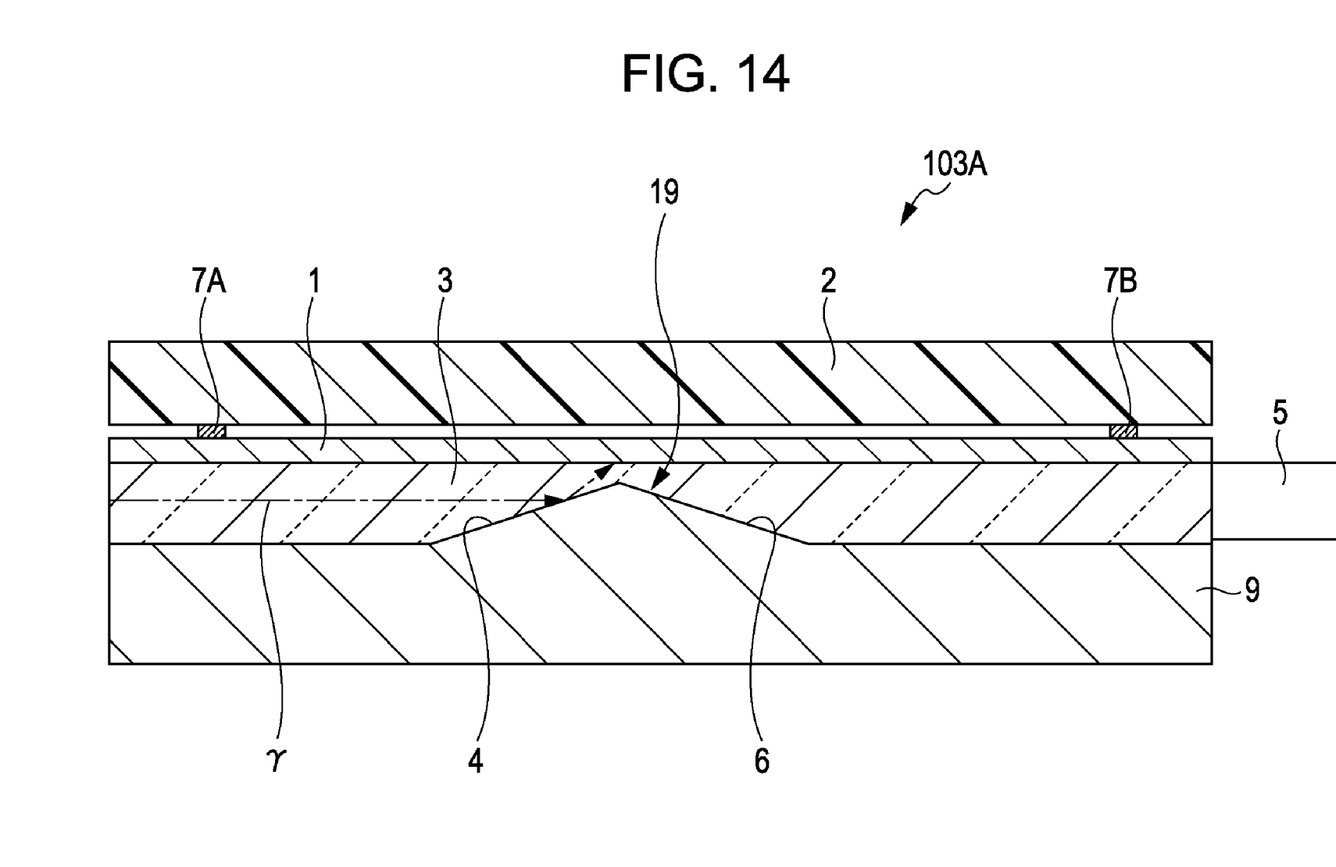
FIG. 14 is a sectional view of an optical touch sensor according to the third embodiment.
Figure 15:
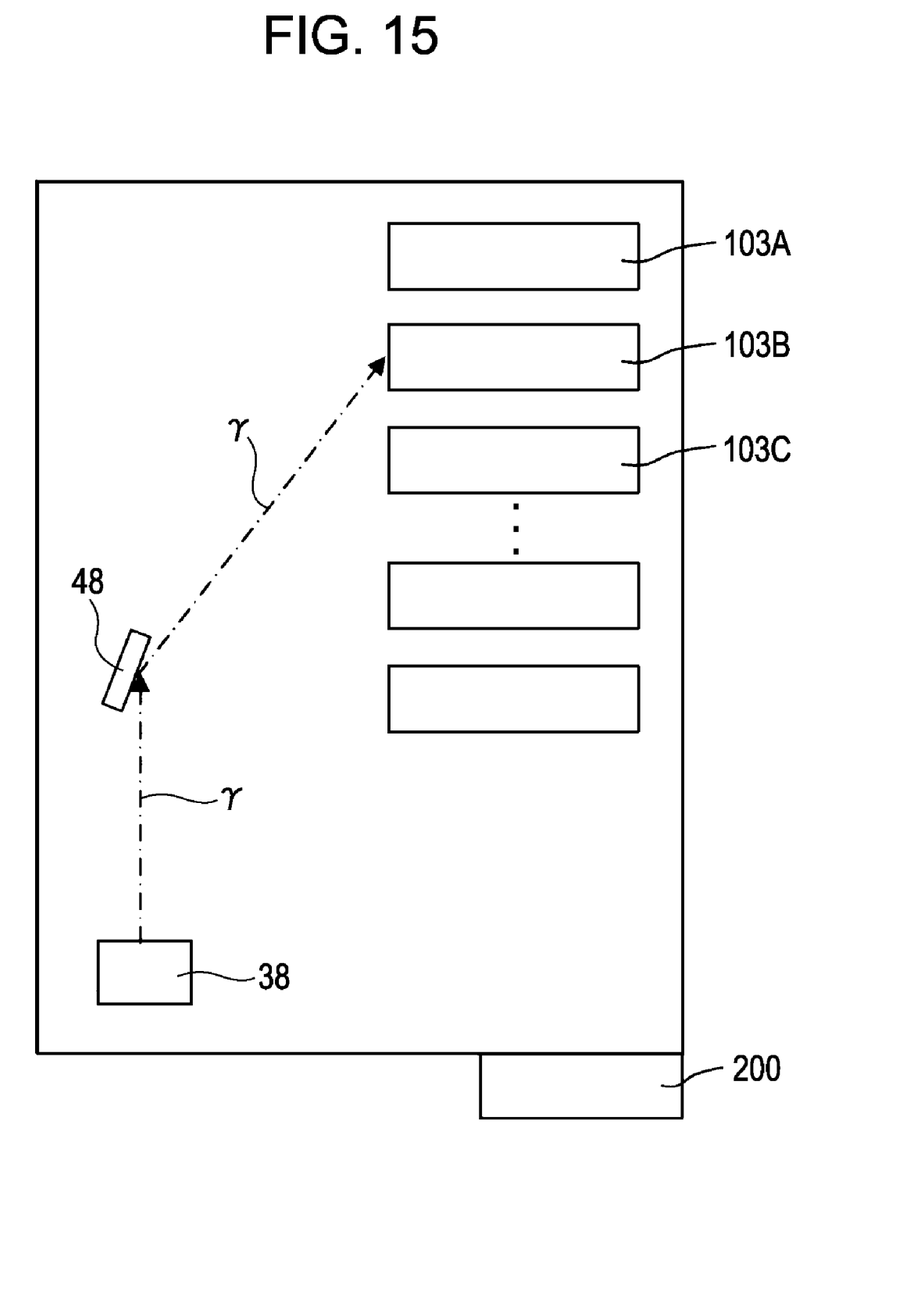
FIG. 15 is a second top view of the sensor system according to the third embodiment.

In this case, light γ is emitted from the light emitter 38 illustrated in FIG. 13, reflected by a selection mirror 48, and incident on the optical path of each of the optical touch sensors 103A, 103B, 103C, . . . . The selection mirror 48 is rotatable. As illustrated in FIGS. 13 and 15, by changing the angle of the selection mirror 48, the light γ can be made incident on the optical path of any of the optical touch sensors 103A, 103B, 103C, . . . . In the sensor system according to the third embodiment, the number of the light emitters 38 can be reduced by using a micro electro mechanical system (MEMS) such as the selection mirror 48, whereby power consumption can be reduced.

Other Embodiments

It should not be understood that the embodiments described above limit the scope of the present disclosure. A person skilled in the art can readily conceive various modifications, examples, and operation techniques. For example, in the first embodiment, the metal layer 1 illustrated in FIG. 2 has a thickness equal to or smaller than half the wavelength of the light γ that propagates through the optical path 3. Alternatively, the metal layer 1 may include a pattern structure having a size equal to or smaller than half the wavelength of the light γ. In this manner, it should be understood that various embodiments and the like that are not described here are within the scope of the present disclosure.

The sensor system and the optical touch sensor according to the embodiments can be used, for example, in mobile communication equipment industries including the mobile phone industry and in the gaming machine industry.

What is claimed is:

1. A sensor system comprising:
   a plurality of optical touch sensors arranged in parallel with each other or in a matrix pattern,
   wherein each of the plurality of optical touch sensors includes
      a flexible optical path through which light propagates,
      a flexible metal layer disposed on the optical path, the metal layer having a thickness equal to or smaller than half a wavelength of the light that propagates through the optical path or the metal layer including a structure having a size equal to or smaller than half the wavelength of the light that propagates through the optical path,
      a flexible touch key configured to contact the metal layer when being bent,
      an incident light reflecting surface disposed on the optical path, the incident light reflecting surface making the light that propagates through the optical path be incident on the metal layer at an angle at which surface plasmon resonance occurs when the metal layer and the touch key are separated from each other, and
      a detector configured to detect reflected light from the metal layer and determine that the touch key is pressed in the case where an intensity of the reflected light increases.

2. A sensor system comprising:
   a plurality of optical touch sensors arranged in parallel with each other or in a matrix pattern,
   wherein each of the plurality of optical touch sensors includes
      an optical path through which light propagates, a metal layer disposed on the optical path, a flexible touch key configured to contact the metal layer when being bent, an incident light reflecting surface configured to make the light that propagates through the optical path be incident on the metal layer at an angle at which surface plasmon resonance occurs when the metal layer and the touch key are separated from each other, and a detector configured to detect reflected light from the metal layer and determine that the touch key is pressed in the case where an intensity of the reflected light increases.

3. The sensor system according to claim 2,
wherein the incident light reflecting surface is disposed on the optical path.

4. The sensor system according to claim 2,
wherein each of the plurality of optical touch sensors further includes a reflected light reflecting surface that reflects the reflected light from the metal layer into the optical path.

5. The sensor system according to claim 2,
wherein each of the plurality of optical touch sensors further includes a spacer disposed between the metal layer and the touch key.

6. The sensor system according to claim 2,
wherein a thickness of the metal layer is equal to or smaller than half a wavelength of the light that propagates through the optical path.

7. The sensor system according to claim 2,
wherein a structure is disposed on the metal layer, the structure having a size equal to or smaller than half a wavelength of the light that propagates through the optical path.

8. The sensor system according to claim 2,
wherein each of the plurality of optical touch sensors further includes a light emitter configured to provide the light that propagates through the optical path.

9. The sensor system according to claim 2 further comprising:
a light emitter configured to provide light to the optical path of each of the plurality of optical touch sensors.

10. The sensor system according to claim 2,
wherein the optical path and the metal layer are flexible.

11. The sensor system according to claim 2,
wherein each of the plurality of optical touch sensors includes a transparent film disposed between the metal layer and the optical path.

12. An optical touch sensor comprising:
an optical path through which light propagates;
a metal layer disposed on the optical path;
a flexible touch key configured to contact the metal layer when being bent;
an incident light reflecting surface configured to make the light that propagates through the optical path be incident on the metal layer at an angle at which surface plasmon resonance occurs when the metal layer and the touch key are separated from each other; and
a detector configured to detect reflected light from the metal layer and determine that the touch key is pressed in the case where an intensity of the reflected light increases.

13. The optical touch sensor according to claim 12,
wherein the incident light reflecting surface is disposed on the optical path.

14. The optical touch sensor according to claim 12 further comprising:
a reflected light reflecting surface that reflects the reflected light from the metal layer into the optical path.

15. The optical touch sensor according to claim 12 further comprising:
a spacer disposed between the metal layer and the touch key.

16. The optical touch sensor according to claim 12,
wherein a thickness of the metal layer is equal to or smaller than half a wavelength of the light that propagates through the optical path.

17. The optical touch sensor according to claim 12,
wherein a structure is disposed on the metal layer, the structure having a size equal to or smaller than half a wavelength of the light that propagates through the optical path.

18. The optical touch sensor according to claim 12 further comprising:
a light emitter configured to provide the light that propagates through the optical path.

19. The optical touch sensor according to claim 12,
wherein the optical path and the metal layer are flexible.

20. The optical touch sensor according to claim 12 further comprising:
a transparent film disposed between the metal layer and the optical path.

* * * * *